United States Patent
Reinmuth

(10) Patent No.: US 11,932,532 B2
(45) Date of Patent: Mar. 19, 2024

(54) MICROMECHANICAL COMPONENT FOR A PRESSURE SENSOR DEVICE

(71) Applicant: Robert Bosch GmbH, Stuttgart (DE)

(72) Inventor: Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 433 days.

(21) Appl. No.: 17/383,998

(22) Filed: Jul. 23, 2021

(65) Prior Publication Data
US 2022/0041435 A1 Feb. 10, 2022

(30) Foreign Application Priority Data
Aug. 6, 2020 (DE) .......................... 102020209973.1

(51) Int. Cl.
*B81C 1/00* (2006.01)
*B81B 7/02* (2006.01)

(52) U.S. Cl.
CPC ............ *B81C 1/00158* (2013.01); *B81B 7/02* (2013.01); *B81B 2201/0264* (2013.01); *B81B 2203/0127* (2013.01)

(58) Field of Classification Search
CPC .................. B81C 1/00158; B81B 7/02; B81B 2201/0264; B81B 2203/0127
See application file for complete search history.

(56) References Cited

U.S. PATENT DOCUMENTS 10,845,262 B2 * 11/2020 Reinmuth ............. G01P 15/125

* cited by examiner

*Primary Examiner* — Samuel A Gebremariam
(74) *Attorney, Agent, or Firm* — NORTON ROSE FULBRIGHT US LLP; Gerard A. Messina

(57) ABSTRACT

A micromechanical component for a pressure sensor device. The component includes a substrate; a frame structure, mounted on a boundary surface of the substrate, including a diaphragm, whose inner diaphragm side borders on an interior volume, framed by the frame structure, so that when a pressure prevailing on its outer diaphragm side is above a reference pressure, the diaphragm is warped into the interior volume; and a rocker structure suspended on the inner diaphragm side, which in its operating mode is set into a rocker motion. An open gap exists between a stop face of the rocker structure and the boundary surface when a pressure prevailing on the outer diaphragm side is above the reference pressure and below a minimum operating pressure. The open gap is closed only when a pressure prevailing on the outer diaphragm side becomes greater or equal to the minimum operating pressure.

11 Claims, 10 Drawing Sheets

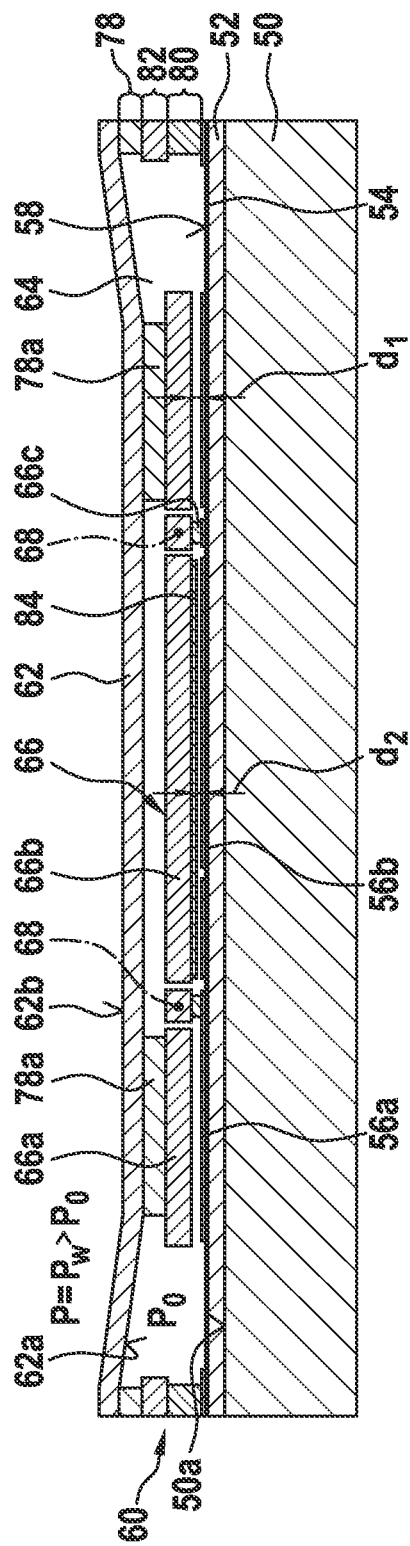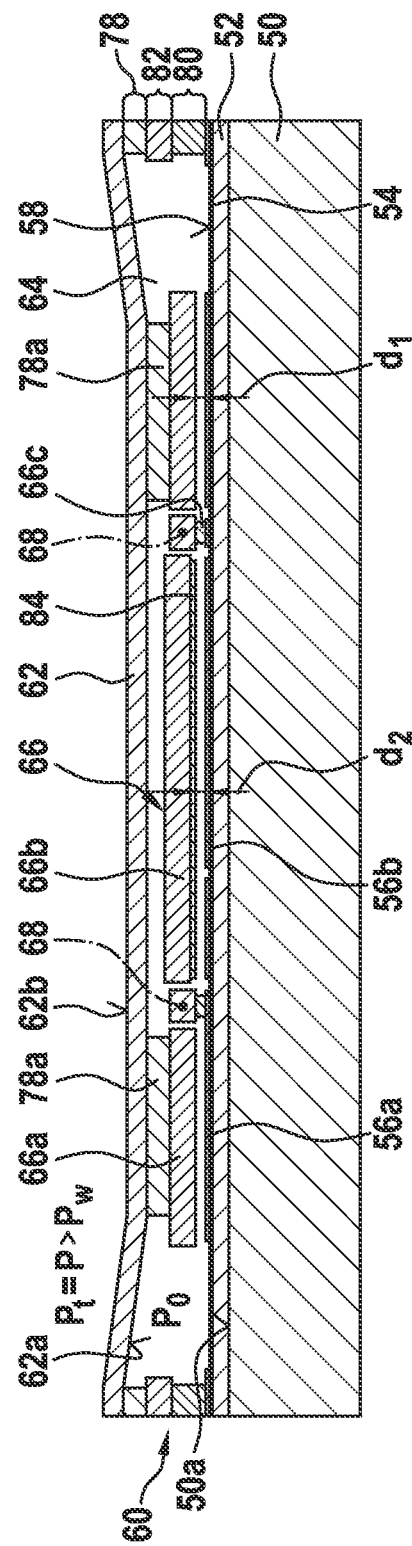

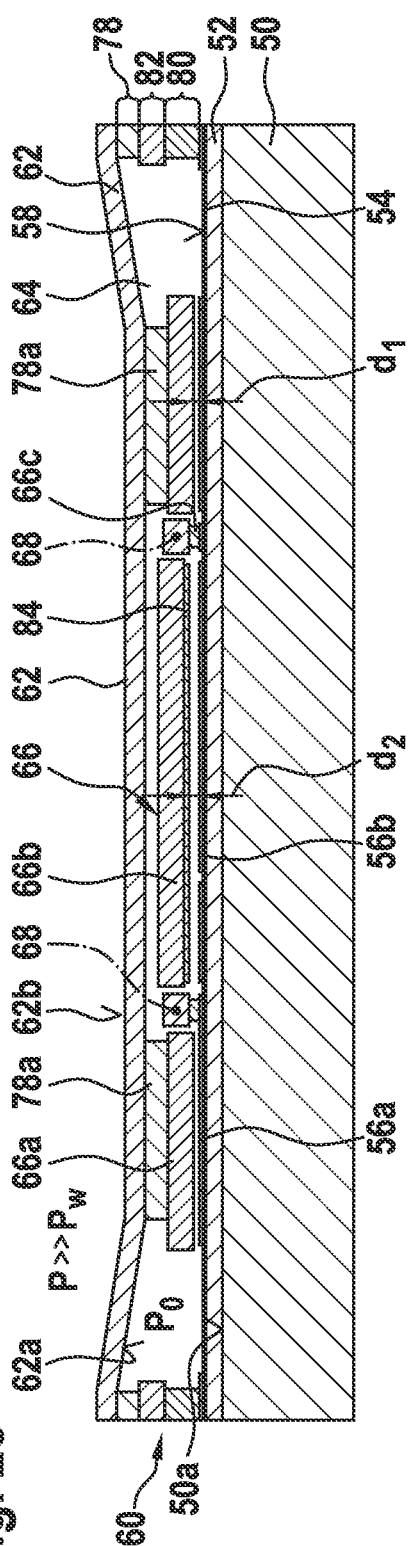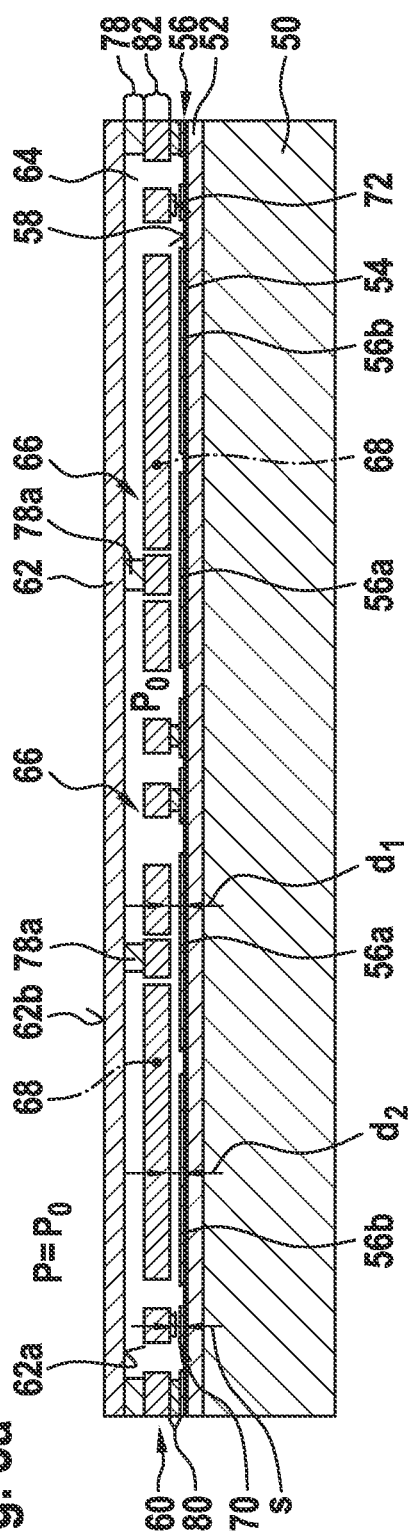

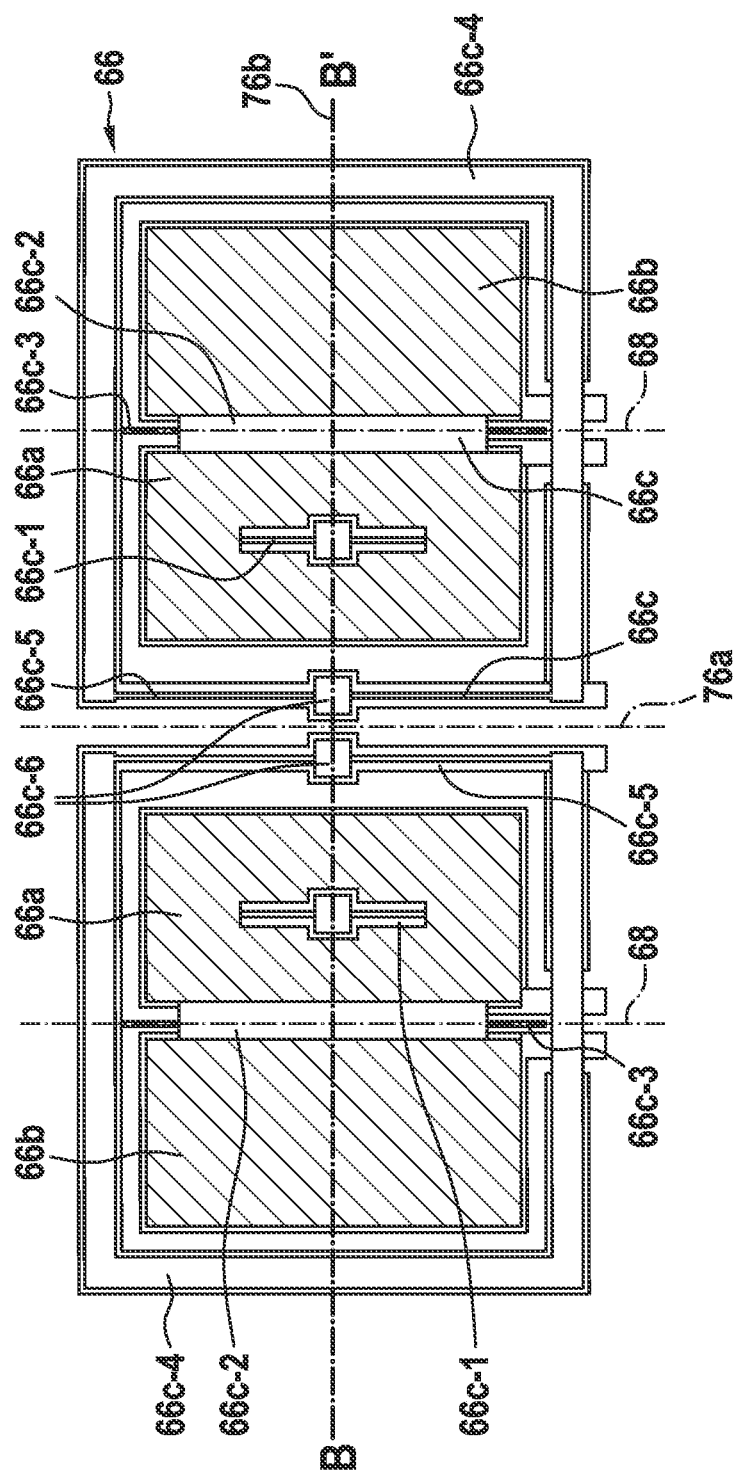

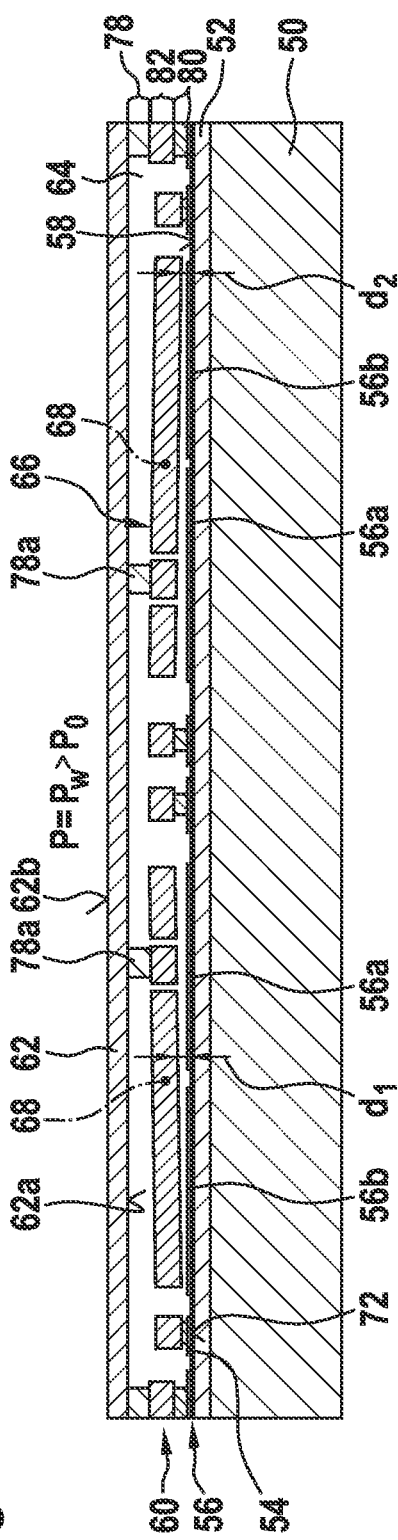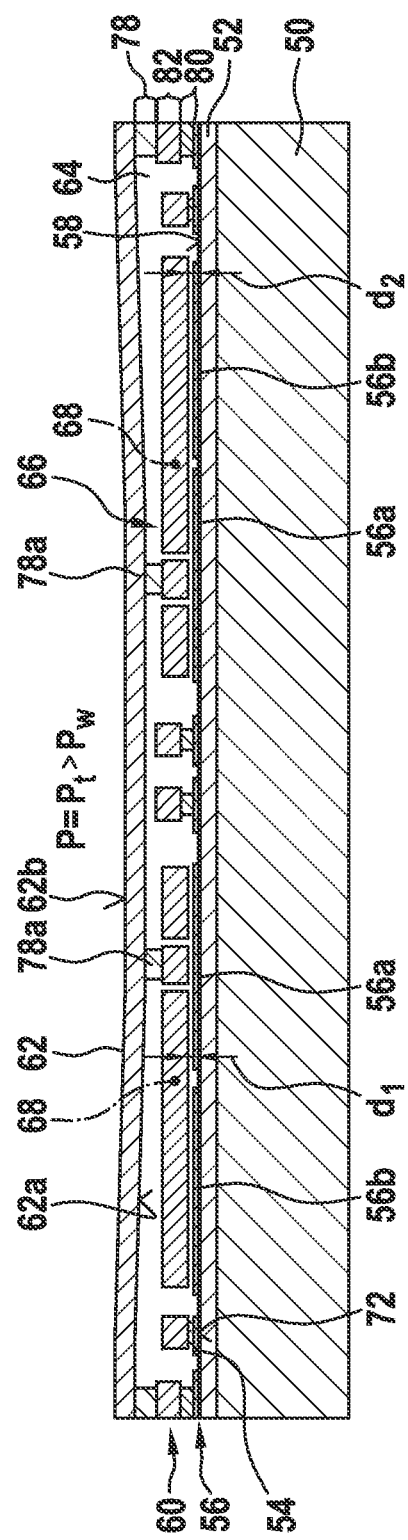

MICROMECHANICAL COMPONENT FOR A PRESSURE SENSOR DEVICE

CROSS REFERENCE

The present application claims the benefit under 35 U.S.C. § 119 of German Patent Application No. DE 102020209973.1 filed on Aug. 6, 2020, which is expressly incorporated herein by reference in its entirety.

FIELD

The present invention relates to a micromechanical component for a pressure sensor device. The present invention also relates to a pressure sensor device. Furthermore, the present invention relates to a method for producing a micromechanical component for a pressure sensor device.

BACKGROUND INFORMATION

FIGS. 1a through 1d show schematic representations of a conventional pressure sensor, which is Applicant's internal related art, and a top view onto its rocker structure.

The conventional pressure sensor illustrated schematically in FIGS. 1a through 1d comprises a substrate 10, whose substrate surface 10a is covered by multiple intermediate layers 12, 14, 16a and 16b, a frame structure 18 situated above intermediate layers 12, 14, 16a and 16b, a diaphragm 20 mounted on the frame structure 18 and a rocker structure 22 suspended on diaphragm 20. A inner side 20a of diaphragm 20, on which rocker structure 22 is suspended, borders on an interior volume 24, framed by frame structure 18 and having an internal reference pressure $p_0$, in such a way that diaphragm 20 is able to react to a pressure p prevailing on its outer diaphragm side 20b that is unequal to reference pressure $p_0$ with a warping of diaphragm 20.

The rocker structure 22 suspended on inner diaphragm side 20a serves to detect a warping of diaphragm 20. For this purpose, rocker structure 22 comprises a first electrode 22a suspended on inner diaphragm side 20a and a second electrode 22b, which is connected via an intermediate component 22c to first electrode 22a (see FIG. 1b). Due to the design of rocker structure 22, a warping of diaphragm 20 is convertible into a tilting motion at least of intermediate component 22c about a tilting axis 26 oriented in parallel to substrate surface 10a. As one of intermediate layers 12, 14, 16a and 16b, the conventional pressure sensor also comprises a first counter electrode 16a associated with first electrode 22a and a second counter electrode 16b associated with second electrode 22b.

FIG. 1a shows the conventional pressure sensor in the case of equal pressure on inner side 20a and outer side 20b of diaphragm 20 ($p=p_0$). FIG. 1c, by contrast, shows the conventional pressure sensor in the case of a pressure p prevailing on the outer diaphragm side 20b that is above reference pressure $p_0$ ($p>p_0$). For this reason, in the situation shown in FIG. 1c, diaphragm 20 is warped into interior volume 24 and at least the intermediate component 22c of rocker structure 22 is tilted about tilting axis 26 in such a way that, in comparison with FIG. 1a, a first distance $d_1$ between first electrode 22a and its associated first counter electrode 16a is reduced and a second distance $d_2$ between second electrode 22b and its associated second counter electrode 16b is increased.

As is shown schematically in FIG. 1d, in the conventional pressure sensor there is the risk, however, that in case of a pressure prevailing on outer diaphragm side 20b that is markedly above reference pressure $p_0$ ($p \gg p_0$), second electrode 22b abuts against diaphragm 20 that is warping severely into interior volume 24 (see arrow 28).

SUMMARY

The present invention provides a micromechanical component for a pressure sensor device, a pressure sensor device, and a production method for a micromechanical component for a pressure sensor device.

The present invention provides micromechanical components for pressure sensor devices, which, compared to the related art, are better suited for an operating range of pressures to be measured that are markedly above a reference pressure prevailing in the respective micromechanical component. In particular, in a micromechanical component according to an example embodiment of the present invention, its reference pressure may be (nearly) equal to vacuum, while it is nevertheless possible to measure without difficulty an operating range of pressures to be measured of 700 to 1100 mbar using the respective micromechanical component. As will be explained more precisely below, in a micromechanical component of this kind, a great and at the same time linear change of its measuring signal is ensured even when its operating range deviates markedly from its reference pressure. A micromechanical component according to the present invention is therefore not only more versatile in its use, but it is also able to interact with comparatively cost-effective electronic equipment that requires little space.

In one advantageous specific embodiment of the micromechanical component of the present invention, in case of a pressure prevailing on the outer diaphragm side that is above the reference pressure, but below the minimum operating pressure, the rocker structure is adjustable and/or tiltable by the diaphragm warping into the interior volume in such a way that a respective gap width of the at least one open gap between the at least one stop face of the rocker structure and the boundary surface decreases. The micromechanical component thus reacts to an approach of the pressure prevailing on the outer diaphragm side to the minimum operating pressure with an "approaching movement" of the at least one stop face of the rocker structure to the boundary surface, whereby the micromechanical component/its rocker structure is automatically transferred into the operating mode, as soon as the pressure prevailing on the outer diaphragm side is equal to the minimum operating pressure.

In accordance with an example embodiment of the present invention, the rocker structure preferably has at least one first electrode and is suspended at its at least one first electrode on the inner side of the diaphragm, the rocker structure in its operating mode being able to be set into its rocker motion by the diaphragm warping into the interior volume in such a way that a first distance between the at least one first electrode and the boundary surface decreases. At least by detecting the decreasing first distance between the at least one first electrode and the boundary surface, it is thus possible to establish/detect a pressure currently prevailing on the outer side of the diaphragm.

In accordance with an example embodiment of the present invention, the rocker structure preferably comprises, in addition to the at least one first electrode, at least one second electrode, the rocker structure in its operating mode being able to be set into its rocker motion by the diaphragm warping into the interior volume in such a way that a second distance between the at least one second electrode and the boundary surface increases. In the specific embodiment of the micromechanical component described here, the increase of the second distance between the at least one second electrode and the boundary surface can thus also be used for establishing/detecting the pressure prevailing on the outer side of the diaphragm. In particular, in the specific embodiment of the micromechanical component described here, it is also possible to perform a differential measurement and/or differential evaluation for the more precise and reliable establishment/detection of the pressure prevailing on the outer side of the diaphragm.

For example, the at least one second electrode may be attached to the at least one first electrode via at least one intermediate component of the rocker structure, at least the at least one intermediate component of the rocker structure in its operating mode being tiltable about respectively one tilting axis oriented in parallel to the substrate surface by the diaphragm warping into the interior volume. In this case, the at least one stop face of the rocker structure may be developed respectively on a projection of the at least one intermediate component that is directed toward the substrate. In this manner, it is possible to ensure reliably that in the event of a mechanical contact of the at least one stop face with the boundary surface, the rocker structure is automatically transferred into its operating mode.

In a further advantageous specific embodiment of the micromechanical component of the present invention, in case of a pressure prevailing on the outer side of the diaphragm that is above the reference pressure, but below the minimum operating pressure, the rocker structure is adjustable and/or tiltable by the diaphragm warping into the interior volume in such a way that the second distance between the at least one second electrode and the boundary surface decreases. On the basis of a detection of a decrease of the second distance between the at least one second electrode and the boundary surface in spite of an increasing warping of the diaphragm, it is thus possible to discern reliably that the micromechanical component/the rocker structure is not in its operating mode, and thus that the pressure prevailing on the outer side of the diaphragm is still below the minimum operating pressure.

In accordance with an example embodiment of the present invention, the micromechanical component preferably comprises at least one first counter electrode and at least one second counter electrode as the at least one intermediate layer covering the substrate surface at least partially, and the boundary surface comprises the outer surfaces of the at least one first counter electrode and of the at least one second counter electrode facing away from the substrate surface, the first distance between the at least one first electrode and the boundary surface being equal to the distance between the at least one first electrode and the at least one first counter electrode and the second distance between the at least one second electrode and the boundary surface being equal to the distance between the at least one second electrode and the at least one second counter electrode. The interaction of the electrodes and counter electrodes described here thus makes it possible to determine the pressure prevailing on the outer side of the diaphragm with good precision and a relatively low error rate.

In another advantageous specific embodiment of the micromechanical component of the present invention, when the pressure prevailing on the outer side of the diaphragm is equal to the minimum operating pressure, the second distance between the at least one second electrode and the at least one second counter electrode is smaller than the first distance between the at least one first electrode and the at least one first counter electrode. An equality of the first distance and the second distance thus exists only at a pressure that may be called a "target operating pressure" within the operating range of the respective micromechanical component. This ensures an (essentially) linear change of the measuring signal determined by the electrodes and counter electrodes in reaction to a pressure change within the operating range of the micromechanical component.

The advantages described above may also be ensured when using a pressure sensor device having a micromechanical component of this kind.

Furthermore, an implementation of a corresponding method for producing a micromechanical component for a pressure sensor device also produces the advantages described above. It is pointed out explicitly that the production method in accordance with the specific embodiments of micromechanical components explained above is capable of being developed further, in view of the disclosure herein.

BRIEF DESCRIPTION OF THE DRAWINGS

Additional features and advantages of the present invention are explained below with reference to the figures.

FIGS. 2a through 2e show schematic representations of a first specific embodiment of the micromechanical component and a top view onto its rocker structure, in accordance with the present invention.

FIGS. 3a through 3g show schematic representations of a second specific embodiment of the micromechanical component, a top view onto its rocker structure and coordinate systems for explaining their manner of functioning, in accordance with the present invention.

DETAILED DESCRIPTION OF EXAMPLE EMBODIMENTS

Figure 1A:
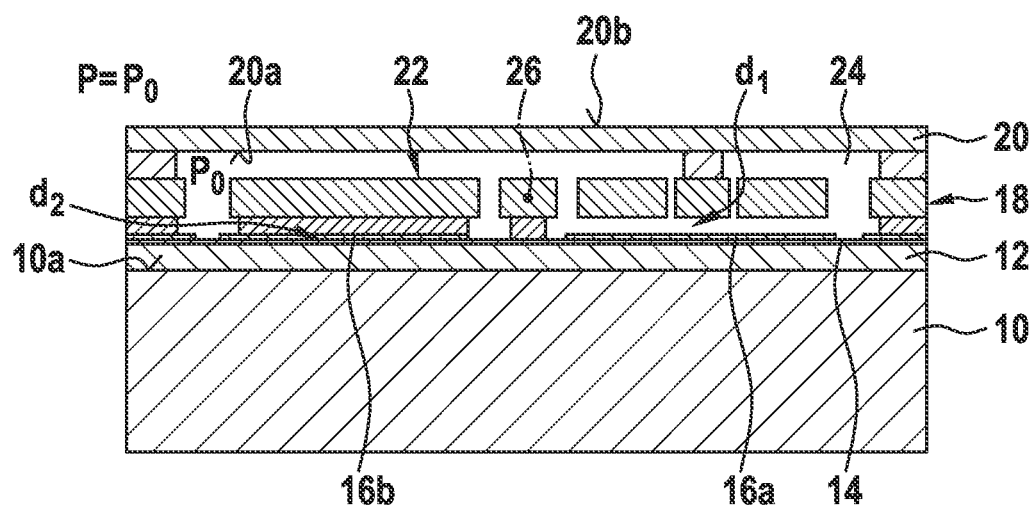
FIGS. 1a through 1d show schematic representations of a conventional pressure sensor and a top view onto its rocker structure.
Figure 1B:
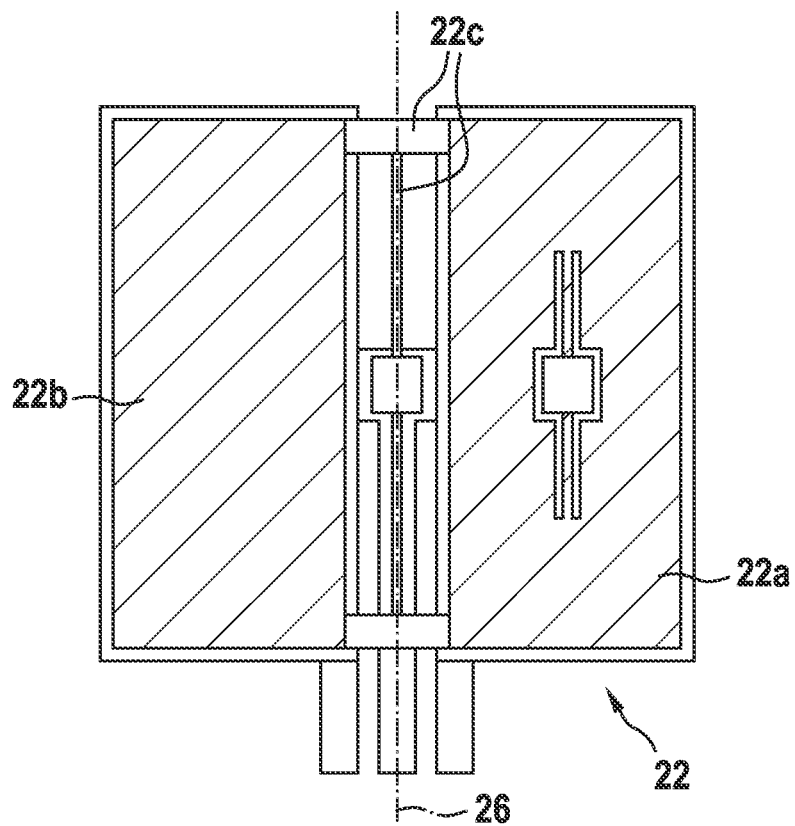
Figure 1C:
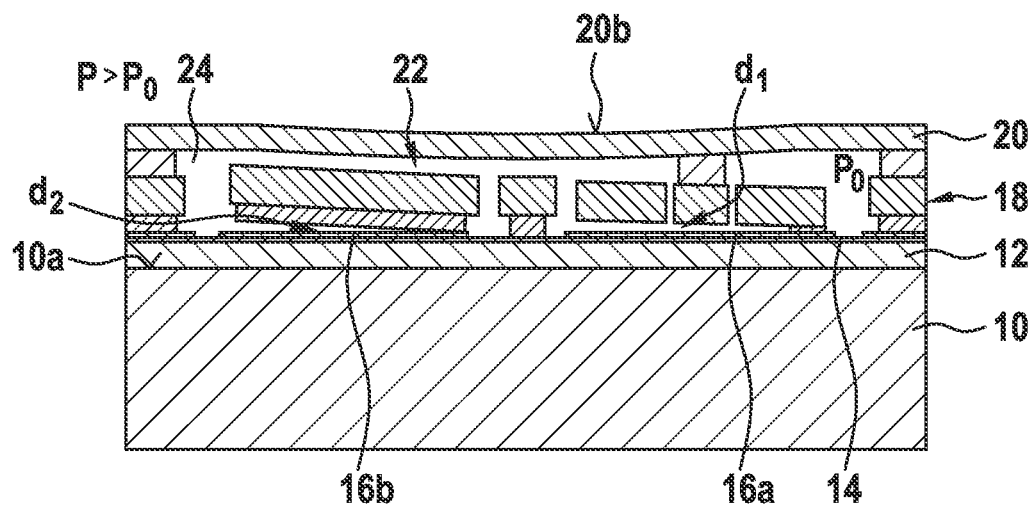
Figure 1D:
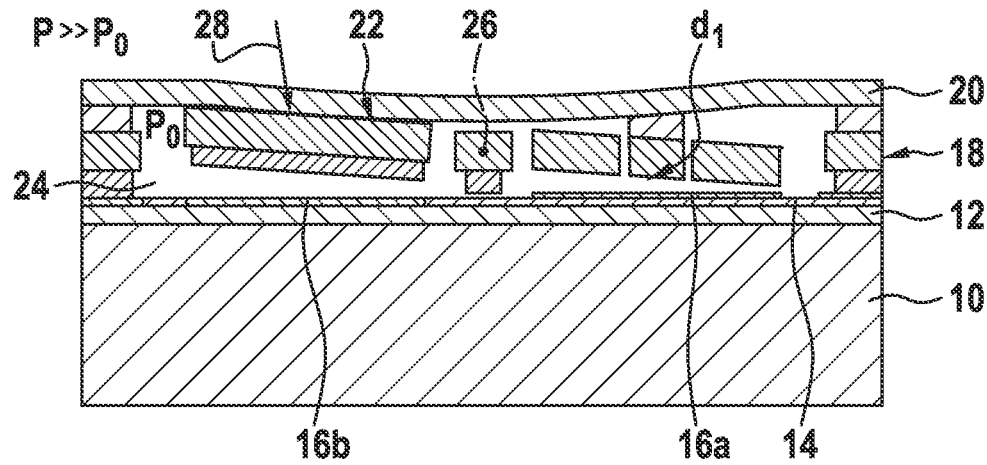
Figure 2A:
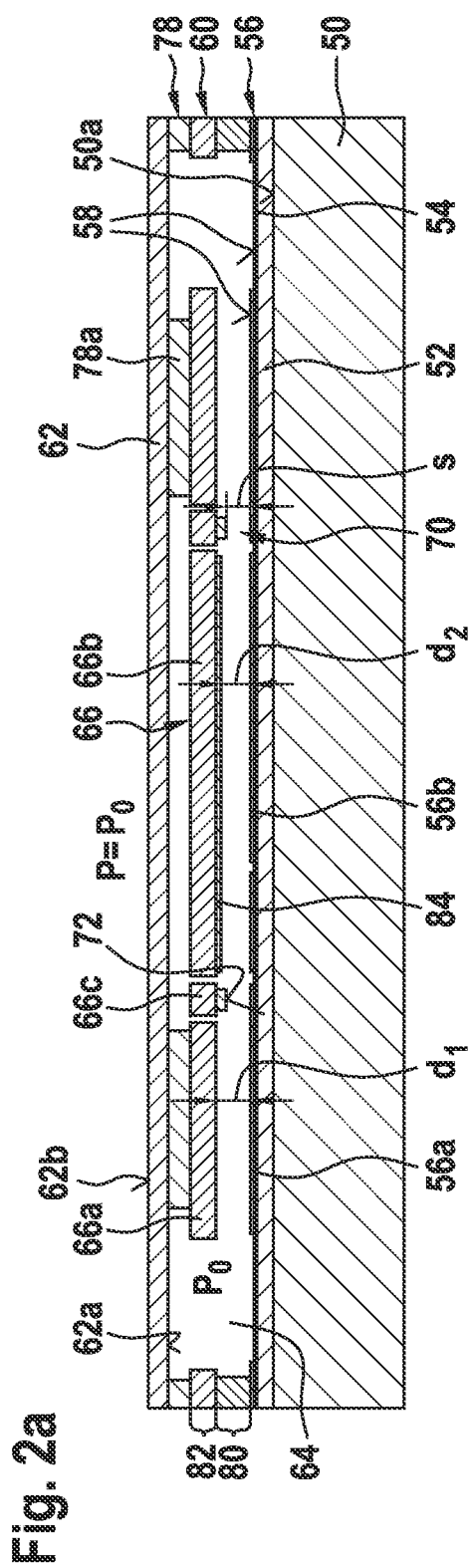
Figure 2B:
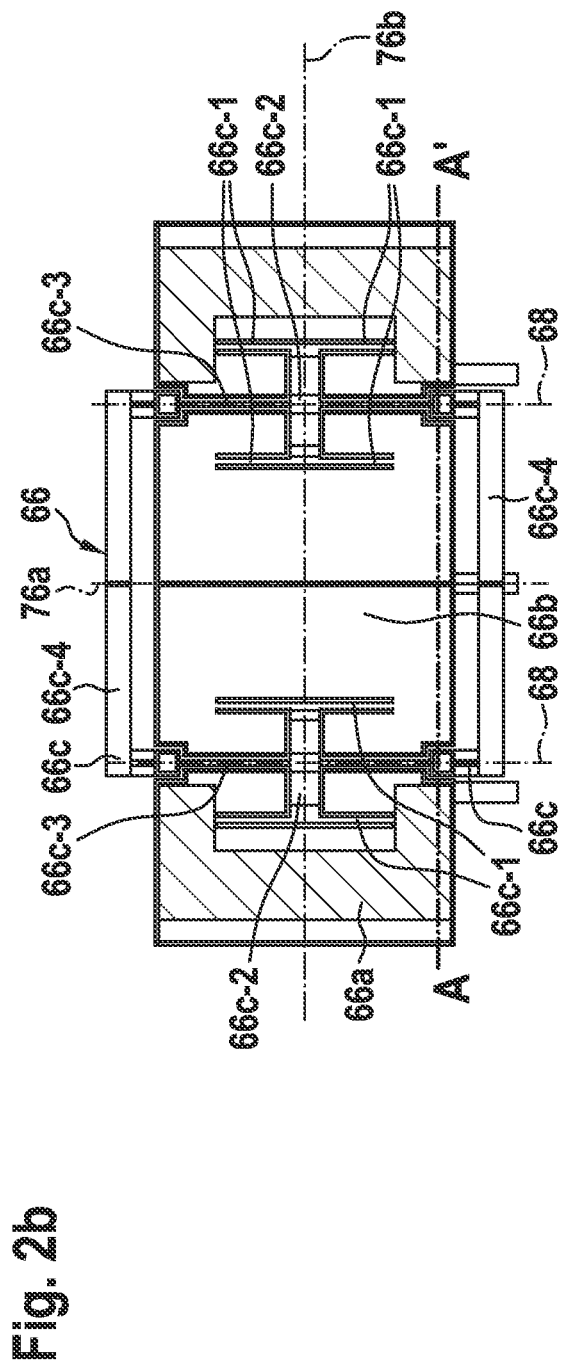

FIGS. 2a through 2e show schematic representations of a first specific embodiment of the micromechanical component and a top view onto its rocker structure, FIGS. 2a, 2c, 2d and 2e respectively showing a cross section along the line AA' of FIG. 2b.

The micromechanical component shown schematically in FIGS. 2a through 2e may be used as (at least part of) a pressure sensor device. The micromechanical component has a substrate 50 having a boundary surface 58 formed by a substrate surface 50a of substrate 50 and/or by at least one intermediate layer 52 through 56 at least partially covering substrate surface 50a. Substrate 50 may be a semiconductor substrate for example, in particular a silicon substrate. In the specific embodiment of FIGS. 2a through 2e, the substrate surface 50a is covered by way of example with a silicon dioxide layer 52, a silicon nitride layer 54 and remaining areas of an electrode material layer 56. It should be noted, however, that the intermediate layers 52 through 56 mentioned here are to be interpreted merely in exemplary fashion.

A frame structure 60, on which a diaphragm 62 is mounted, is situated on boundary surface 58. Diaphragm 62 has an inner diaphragm side 62a, which borders on an interior volume 64 framed by frame structure 60, and an outer diaphragm side 62b facing away from inner diaphragm side 62a. The interior volume 64 may be understood as an "hermetically sealed volume", which is why a reference pressure $p_0$ exists in interior volume 64. Diaphragm 62 is designed to be deformable in such a way that diaphragm 62 is warped into interior volume 64 when a pressure p on its outer diaphragm side 62b is higher than reference pressure $p_0$.

The micromechanical component also has a rocker structure 66 suspended on inner diaphragm side 62a, which in its operating mode is able to be set into a rocker motion by the diaphragm 62 warping into the interior volume 64. As shown in FIG. 2b, rocker structure 66 comprises at least one first electrode 66a and is suspended at its at least one electrode 66a on inner diaphragm side 62a. Advantageously, the rocker structure 66 shown in FIG. 2b has at least one second electrode 66b in addition to the at least one first electrode 66a. The at least one second electrode 66b is connected to the at least one first electrode 66a, by way of example, via at least one intermediate component 66c. In the operational state of rocker structure 66, its at least one intermediate component 66c is tiltable by the diaphragm 62 warping into interior volume 64 about a tilting axis 68 that is respectively oriented in parallel to substrate surface 50a.

FIG. 2a shows the micromechanical component when pressure p on outer diaphragm side 62b is equal to reference pressure $p_0$. It may be seen that in the case of equal pressure on inner diaphragm side 62a and outer diaphragm side 62b, there is respectively an open gap 70 between at least one stop face 72 of rocker structure 66 and boundary surface 58. A gap width s of the at least one open gap 70 between the at least one stop face 72 of rocker structure 66 and boundary surface 58 is defined in such a way that as long as pressure p on the outer diaphragm side 62b is above reference pressure $p_0$, but below a predefined minimum operating pressure $p_w$, the at least one open gap 70 still exists between the at least one stop face 72 and boundary surface 58. When pressure p prevailing on the outer diaphragm side 62b is between reference pressure $p_0$ and the predefined minimum operating pressure $p_w$, rocker structure 66 is thus "held in suspension above boundary surface 58," which is why it is not possible to set rocker structure 66 into its rocker motion in spite of the warping of diaphragm 62 into interior volume 64 due to the pressure p prevailing on the outer diaphragm side 62b between reference pressure $p_0$ and the predefined minimum operating pressure $p_w$. When pressure p on the outer diaphragm side 62b is between reference pressure $p_0$ and the predefined minimum operating pressure $p_w$, rocker structure 66 is therefore not in its operating mode. The minimum operating pressure $p_w$ is predefined by the gap width s of the at least one open gap 70 when the pressure is the same on the inner diaphragm side 62a and on the outer diaphragm side 62b.

FIG. 2c shows the micromechanical component when a pressure p on the outer diaphragm side 62b of diaphragm 62 equals the predefined minimum operating pressure $p_w$ ($p=p_w$). It may be seen from FIG. 2c that the at least one previously open gap 70 between the at least one stop face 72 of rocker structure 66 and boundary surface 58 is closed only when pressure p on outer diaphragm side 62b becomes equal to minimum operating pressure $p_w$, whereby rocker structure 66 is transferred into its operating mode. As becomes apparent from a comparison of FIGS. 2a and 2c, at a pressure p on the outer diaphragm side 62b that is above reference pressure $p_0$, but below minimum operating pressure $p_w$, rocker structure 66 is adjustable and/or tiltable by the diaphragm 62 warping into interior volume 64 in such a way that the respective gap width s of the at least one open gap 70 between the at least one stop face 72 of rocker structure 66 and the boundary surface 58 decreases, and eventually equals 0 when a pressure p prevailing on the outer diaphragm side 62b becomes equal to the minimum operating pressure $p_w$. The at least one stop face 72 may thus be called a "movable stop face" or as a "stop face of a movable stop structure". At a pressure p prevailing on the outer diaphragm side 62b between the reference pressure $p_0$ and the minimum operating pressure $p_w$, rocker structure 66 thus moves toward boundary surface 58, but only touches the latter when the minimum operating pressure $p_w$ prevails on outer diaphragm side 62b. For this reason, the at least one previously open gap 70 between the at least one stop face 72 and boundary surface 58 is closed only when the minimum operating pressure $p_w$ prevails on outer diaphragm side 62b.

FIGS. 2d and 2e respectively show the micromechanical component when a pressure p on outer diaphragm side 62b is above minimum operating pressure $p_w$. It may be seen that as pressure p becomes equal to minimum operating pressure $p_w$ on outer diaphragm side 62b, rocker structure 66 reacts to a further warping of diaphragm 62 into interior volume 64 with its rocker motion, or with a continuation of its rocker motion. It may also be seen from FIGS. 2d and 2e that the at least one previously open gap 70 between the at least one stop face 72 of rocker structure 66 and boundary surface 58 remains closed when pressure p on outer diaphragm side 62b is greater than or equal to the minimum operating pressure $p_w$.

In the example of FIGS. 2a through 2e, the micromechanical component has at least one first counter electrode 56a and at least one second counter electrode 56b as the at least one intermediate layer 52 through 56 covering the at least one substrate surface 50a at least partially, the at least one first counter electrode 56a and the at least one second counter electrode 56b being patterned out of electrode material layer 56 merely by way of example. Boundary surface 58 thus also comprises the outer surfaces of the at least one first counter electrode 56a and of the at least one second counter electrode 56b facing away from substrate surface 50a. Electrodes 66a and 66b of rocker structure 66 and counter electrodes 56a and 56b are able to be contacted in such a way that a first voltage/capacitance applied between the at least one first electrode 66a and the at least one first counter electrode 56a and a second voltage/capacitance applied between the at least one second electrode 66b and the at least one second counter electrode 56b are able to be tapped off/ascertained. The first voltage/capacitance corresponds to a first distance $d_1$ between the at least one first electrode 66a and the at least one first counter electrode 56a (or a distance between the at least one first electrode 66a and the boundary surface 58). The second voltage/capacitance likewise corresponds to a second distance $d_2$ between the at least one second electrode 66b and the at least one second counter electrode 56b (or a distance between the at least one second electrode 66b and the boundary surface 58).

From the comparison of FIGS. 2a and 2c, it may also be discerned that at a pressure p between reference pressure $p_0$ and minimum operating pressure $p_w$ present on the outer diaphragm side 62b, rocker structure 66 is adjustable and/or tiltable by diaphragm 62 warping into interior volume 64 in such a way that both the first distance $d_1$ between the at least one first electrode 66a and the at least one first counter electrode 56a as well as the second distance $d_2$ between the at least one second electrode 66b and the at least one second counter electrode 56b decrease. By comparing FIGS. 2c and 2d, it may be discerned that at a pressure p prevailing on the outer diaphragm side 62b that is greater than or equal to minimum operating pressure $p_w$, rocker structure 66 in its operating mode is able to be set/is set into its rocker motion by diaphragm 62 warping into interior volume 64 in such a way that the first distance $d_1$ between the at least one first electrode 66a and the at least one first counter electrode 56a decreases, while at the same time the second distance $d_2$ between the at least one second electrode 66b and the at least one second counter electrode 56b increases. As soon as the at least one stop face 72 of rocker structure 66 rests on boundary surface 58, the direction of movement of the at least one second electrode 66b changes due to the mechanical contact of the at least one stop face 72 with boundary surface 58 and the design of rocker structure 66. This may be brought about for example in that, as long as no mechanical contact exists between the at least one stop face 72 of rocker structure 66 and boundary surface 58, a spring constant of the at least one intermediate component 66c is greater than a "spring constant" between the at least one stop face 72 and boundary surface 58.

The micromechanical component of FIGS. 2a through 2e is therefore well suited for establishing/detecting the pressure p prevailing on outer diaphragm side 62b. In particular, in the specific embodiment described here, it is possible to determine the pressure p prevailing on the outer diaphragm side 62b with a comparatively high measurement accuracy and a relatively low error rate by way of a differential measurement and/or differential evaluation of the first voltage/capacitance between the at least one first electrode 66a and the at least one first counter electrode 56a and of the second voltage/capacitance between the at least one second electrode 66b and the at least one second counter electrode 56b.

The reference pressure $p_0$ enclosed in interior volume 64 may be (nearly) a vacuum. This allows for (essentially) frictionless motions of rocker structure 66 in interior volume 64 and thus contributes toward improving an adjustability of its electrodes 66a and 66b. In spite of a reference pressure $p_0$ (nearly) equal to vacuum, the minimum operating pressure $p_w$, which defines the lower pressure limit of an operating range of the micromechanical component/the pressure sensor device implemented thereby, may be chosen to be comparatively high. For example, the operating range of the micromechanical component/the pressure sensor device implemented thereby, within which the pressure p prevailing on the outer diaphragm side 62b is measurable/establishable, may be between 700 and 1100 mbar. The micromechanical component/the pressure sensor device implemented thereby is thus well suited for measuring an atmospheric pressure, for example in order to establish a change in the weather or in order to determine a local elevation of a current measurement position.

Diaphragm 62 may be a comparatively "soft diaphragm" in order to ensure an advantageous measurement sensitivity of the micromechanical component/the pressure sensor device implemented thereby. Nevertheless, diaphragm 62 may still be sufficiently "stiff" so that a change of first distance $d_1$, or a change of second distance $d_2$, at the rocker structure 66 in its operating mode is (essentially) linear to a pressure change of the pressure p prevailing on the outer diaphragm side 62b above minimum operating pressure $p_w$.

The properties of rocker structure 66 described above are readily developed, particularly in that the at least one stop face 72 of rocker structure 66 is respectively developed on a projection of the at least one intermediate component 66c oriented toward substrate 50. As soon as the at least one stop face 72 comes into contact with boundary surface 58, the at least one intermediate component 66c, being pressed against boundary surface 58 by a pressure p on the outer diaphragm side 62b that is greater than or equal to minimum operating pressure $p_w$, is "fixated" and a further warping of diaphragm 62 into interior volume 64 results in a tilting of the at least one intermediate component 66c about its respective tilting axis 68.

As may also be discerned in FIG. 2c, in the micromechanical component described here, when the pressure p prevailing on the outer side of the diaphragm is equal to the minimum operating pressure $p_w$, the second distance $d_2$ between the at least one second electrode 66b and the at least one second counter electrode 56b is smaller than the first distance $d_1$ between the at least one first electrode 66a and the at least one first counter electrode 56a. An equality of the first distance $d_1$ between the at least one first electrode 66a and the at least one first counter electrode 56a with the second distance $d_2$ between the at least one second electrode 66b and the at least one second counter electrode 56b thus exists only when a pressure p on the outer diaphragm side 62b reaches what may be called the target operating pressure $p_t$, the target operating pressure $p_t$ being within the operating range with minimum operating pressure $p_w$ as the lower pressure limit of the operating range. This ensures an (essentially) linear change of first distance $d_1$ between the at least one first electrode 66a and the at least one first counter electrode 56a with the second distance $d_2$ between the at least one second electrode 66b and the at least one second counter electrode 56b as a reaction to a pressure change within the operating range of the micromechanical component. The target operating pressure $p_t$ may be at 900 mbar, for example.

Rocker structure 66 is preferably mirror-symmetrical with respect to two mutually perpendicular mirror symmetry planes 76a and 76b, which are oriented perpendicularly to substrate surface 50a. In the specific embodiment of FIGS. 2a through 2e, rocker structure 66 is moreover developed in such a way that the at least one first electrode 66a of rocker structure 66, when the latter is in its operating mode, is adjustable along an axis (not shown) oriented perpendicularly to substrate surface 50a toward substrate surface 50a by diaphragm 62 warping into interior volume 64, while the at least one second electrode 66b of rocker structure 66, when the latter is in its operating mode, is adjustable along an axis (not shown) oriented perpendicularly to substrate surface 50a away from substrate 50a by diaphragm 62 warping into interior volume 64. The adjustability of electrodes 66a and 66b of rocker structure 66, when the latter is in its operating mode, along the axes oriented perpendicularly to substrate surface 50a effects a relatively great change of the first voltage/capacitance between the at least one first electrode 66a and the at least one first counter electrode 56a and the second voltage/capacitance between the at least one second electrode 66b and the at least one second counter electrode 56b as a reaction to the warping of diaphragm 62 into interior volume 64.

The advantageous adjustability of electrodes 66a and 66b of rocker structure 66, when the latter is in its operating mode, along the axes oriented perpendicularly to substrate surface 50a is implemented in that each of the electrodes 66a and 66b is connected to at least one lever element 66a-2 of the at least one intermediate component 66c via respectively two torsion springs 66c-1 of the at least one intermediate component 66c, respectively one first electrode 66a and respectively one second electrode 66b being connected to each lever element 66c-2 via their torsion springs 66c-1. Via respectively two further torsion springs 66c-3 of the at least one intermediate component 66c, the at least one lever element 66c-2 is connected to respectively one half-frame structure 66c-4 of the at least one intermediate component 66c in such a way that the torsion springs 66c-3 and the half-frame structures 66c-4 form a frame structure. Preferably, the at least one stop face 72 is developed on at least one of the half-frame structures 66c-4, and is therefore set into a purely vertical motion (without rotation and without lateral motion) when diaphragm 62 warps into interior volume 64.

The at least one first electrode 66a may be connected to inner diaphragm side 62a via respectively one buffer area 78a patterned out of an insulating layer 78. As shown in FIGS. 2a, 2c, 2d and 2e, a height of insulating layer 78 oriented perpendicularly to substrate surface 50a may be chosen to be (essentially) relatively great. In this manner, it is possible reliably to prevent the at least one second electrode 66b from striking against the inner diaphragm side 62a of diaphragm 62 warping into interior volume 64. Insulating layer 78 may be e.g. a silicon nitride layer.

The micromechanical component of FIGS. 2a through 2e may be formed from a layer construction, which comprises substrate 50, possibly the at least one intermediate layer 52 through 56 covering substrate surface 50a at least partially, a first semiconductor material layer 80, a second semiconductor material layer 82, insulating layer 78 and diaphragm 62. A maximum height of first semiconductor material layer 80 oriented perpendicularly to substrate surface 50a may also be chosen relatively freely. The at least one first electrode 66a thus does not strike against boundary surface 58 or does so rarely.

By forming different depressions in at least one sacrificial layer (later removed and therefore not shown) deposited on substrate surface 50a and/or on the at least one intermediate layer 52 through 56 prior to depositing the first semiconductor material layer 80, it is possible to form the at least one projection oriented toward substrate 50 with the respective stop face 72 of rocker structure 66 and a material protrusion 84 on the at least one second electrode 66b (in comparison to the at least one first electrode 66a) from the material of first semiconductor material layer 80. The material protrusion 84 on the at least one second electrode 66b makes it possible to ensure that, when the pressure p prevailing on outer diaphragm side 62b is equal to the minimum operating pressure $p_w$, the second distance $d_2$ between the at least one second electrode 66b and the at least one second counter electrode 56b is smaller than the first distance $d_1$ between the at least one first electrode 66a and the at least one first counter electrode 56a.

Figure 3E:
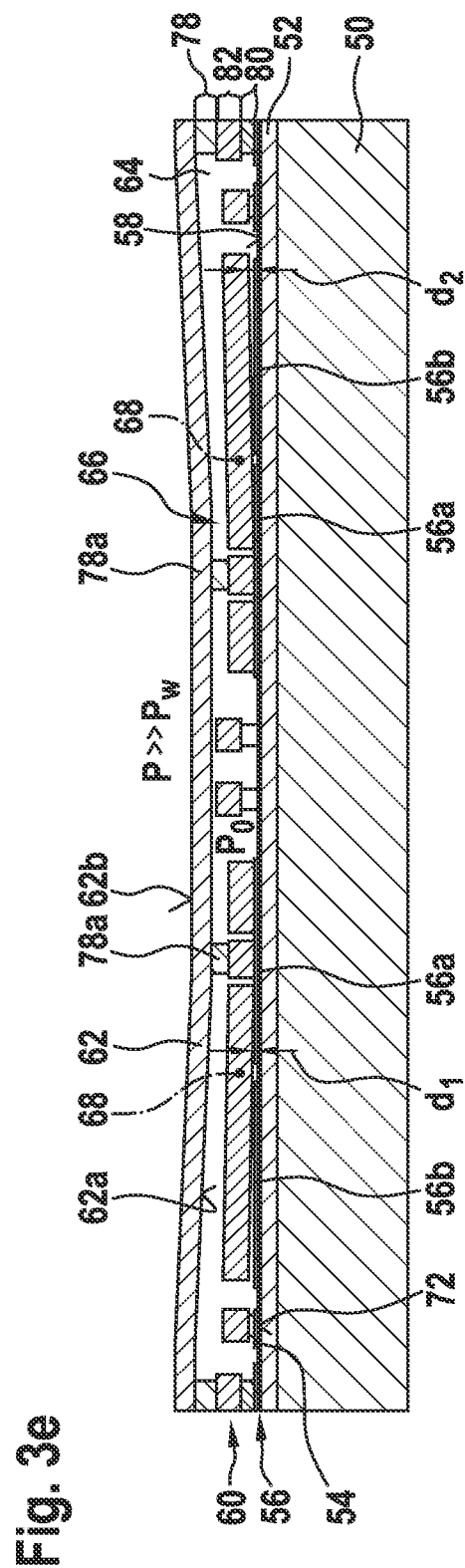

FIGS. 3a through 3g show schematic representations of a second specific embodiment of the micromechanical component, a top view onto its rocker structure and coordinate systems for explaining their manner of functioning, FIGS. 3a, 3c, 3d and 3e respectively showing a cross section along the line BB' of FIG. 3b.

FIG. 3a shows the micromechanical component at a pressure p prevailing on outer diaphragm side 62b equal to reference pressure $p_0$, while FIG. 3c shows the micromechanical component at a pressure p equal to the predefined minimum operating pressure $p_w$ on outer diaphragm side 62b of diaphragm 62 (p=$p_w$). FIGS. 3d and 3e respectively show the micromechanical component at a pressure p prevailing on outer diaphragm side 62b above minimum operating pressure $p_w$, the target operating pressure $p_t$ prevailing on the outer diaphragm side 62b in FIG. 3d.

In the specific embodiment described here, electrodes 66a and 66b undergo a pure tilting motion when diaphragm 62 warps into interior volume 64. For this purpose, the at least one second electrode 66b is firmly connected to the at least one lever element 66c-2 (see FIG. 3b). The at least one first electrode 66a is respectively connected to diaphragm 62 via respectively two torsion springs 66a-1 so as not to limit the tilting motion of rocker structure 66. At the least one lever element 66c-2 is connected to at least one half-frame structure 66c-4 via respectively two further torsion springs 66c-3. Furthermore, the at least one half-frame structure 66c-4 is connected via respectively two further torsion springs 66c-5 to respectively one anchor structure 66c-6 fastened on substrate 50, precisely one half-frame structure 66c-4, the two torsion springs 66c-5 connected thereto, and the anchor structure 66c-6 connected thereto forming one frame structure.

Figure 3F:
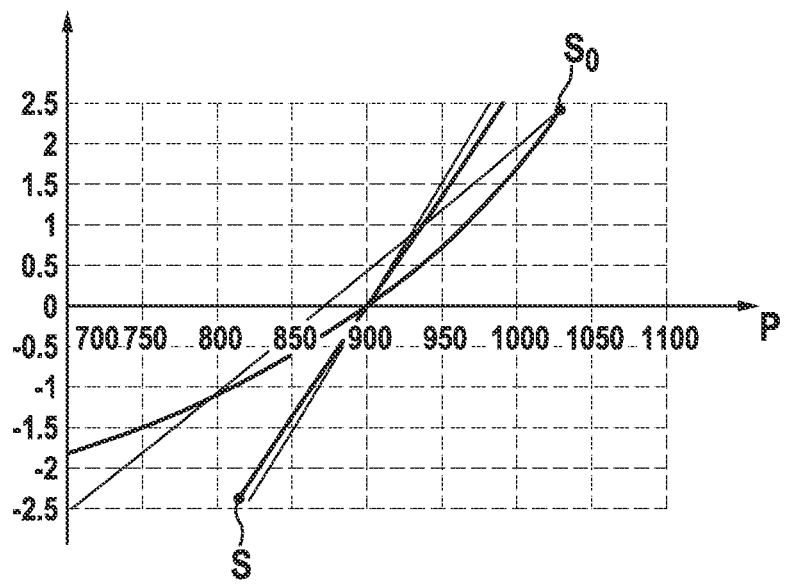
Figure 3G:
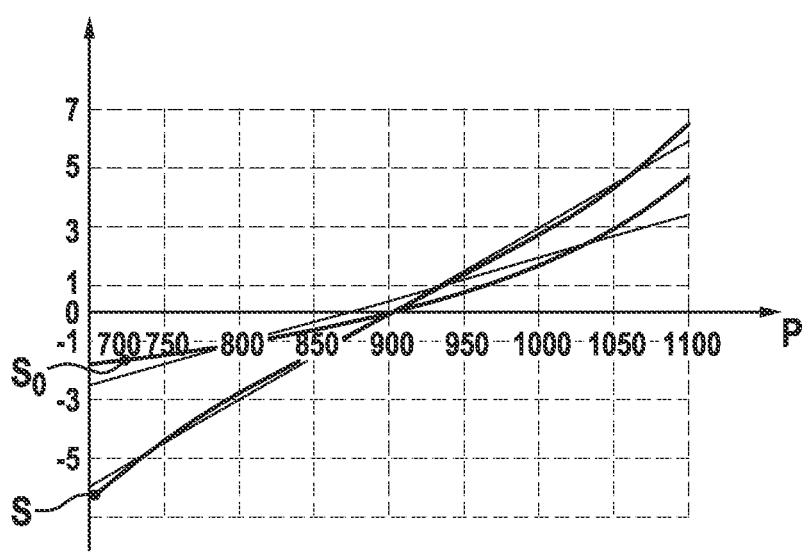

In the coordinate systems of FIGS. 3f and 3g, the abscissa indicates the pressure p prevailing on outer diaphragm side 62b, while the ordinate represents a measuring signal S obtained by differential measurement and/or differential evaluation of the first voltage/capacitance between the at least one first electrode 66a and the at least one first counter electrode 56a and the second voltage/capacitance between the at least one second electrode 66b and the at least one second counter electrode 56b. The coordinate systems of FIGS. 3f and 3g differ merely in terms of the scaling of the ordinate. For comparison, a pressure-dependent signal $S_0$ obtained using a conventional pressure sensor of FIGS. 1a through 1d is also drawn into the coordinate systems of FIGS. 3f and 3g.

As may be seen from the coordinate systems of FIGS. 3f and 3g, in the micromechanical component of FIGS. 3a through 3e, a measuring sensitivity is increased by a factor of at least 2 compared to the conventional pressure sensor of FIGS. 1a through 1d. In particular, at a pressure p close to the minimum operating pressure $p_w$ on the outer diaphragm side 62b (of about 700 mbar), the measuring sensitivity of the micromechanical component of FIGS. 3a through 3e is even increased by a factor of 3.6 compared to the conventional pressure sensor of FIGS. 1a through 1d. In addition, a linearity of a ratio of measuring signal S to pressure p is improved by a factor of 5 in the micromechanical component of FIGS. 3a through 3e compared to the conventional pressure sensor of FIGS. 1a through 1d.

With regard to further characteristics and features of the micromechanical component of FIGS. 3a through 3e and their advantages, reference is made to the description of the specific embodiment of FIGS. 2a through 2e.

All of the micromechanical components described above may be advantageously used for capacitive pressure sensors. In all micromechanical components described above, a good deflectability of their electrodes 56a and 56b, a good linearity of the ratio of their measuring signal S to pressure p and a good measuring sensitivity are ensured. Furthermore, all of the micromechanical components described above may be produced by a relatively simple production process.

Figure 4:
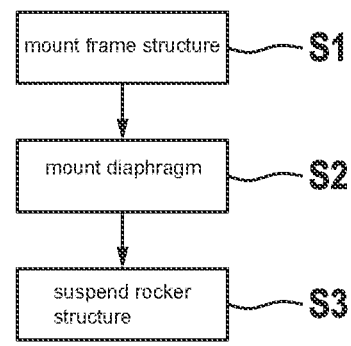
FIG. 4 show a flow chart for explaining a specific embodiment of the production method for a micromechanical component for a pressure sensor device, in accordance with the present invention.

FIG. 4 shows a flow chart for explaining a specific embodiment of the production method for a micromechanical component for a pressure sensor device.

The micromechanical components described above may be produced for example by the production method described below. It should be noted, however, that the feasibility of the production method is not limited to producing these micromechanical components.

In a method step S1, a frame structure is mounted on a boundary surface formed by a substrate surface of a substrate and/or by at least one intermediate layer covering the substrate surface at least partially. As method step S2, a diaphragm is mounted on the frame structure in such a way that its inner diaphragm side borders on an interior volume framed by the frame structure with a reference pressure prevailing therein in such a way that the diaphragm is warped into the interior volume in the case of a pressure prevailing on its outer diaphragm side facing away from the inner diaphragm side that is above the reference pressure.

Furthermore, in a method step S3, a rocker structure is suspended on the inner diaphragm side, which at least in its operating mode is set into a rocker motion by the diaphragm warping into the interior volume. The rocker structure is suspended on the inner diaphragm side in such a way that when a pressure prevailing on the outer diaphragm side is above the reference pressure, but below a predefined minimum operating pressure, there exists an open gap between at least one stop face of the rocker structure and the boundary surface, which is closed only when a pressure prevailing on the outer diaphragm side becomes greater than or equal to the minimum operating pressure, whereby the rocker structure is transferred into its operating mode. Consequently, an implementation of the production method described here also produces the advantages explained above.

Method steps S1 through S3 may be performed in any temporal order, or also in a manner overlapping in time.

What is claimed is:

1. A micromechanical component for a pressure sensor device comprising:
   a substrate having a boundary surface formed by a substrate surface of the substrate and/or by at least one intermediate layer at least partially covering the substrate surface;
   a frame structure, situated on the boundary surface, including a diaphragm whose inner diaphragm side borders on an interior volume, framed by the frame structure and having a reference pressure prevailing within, in such a way that the diaphragm is warped into the interior volume when a pressure prevailing on an outer diaphragm side facing away from the inner diaphragm side is above the reference pressure; and
   a rocker structure suspended on the inner diaphragm side, which at least in an operating mode of the rocker structure is able to be set into a rocker motion by the diaphragm warping into the interior volume;
   wherein when a pressure prevailing on the outer diaphragm side is above the reference pressure, but below a predefined minimum operating pressure, an open gap exists respectively between at least one stop face of the rocker structure and the boundary surface, which is closed only when the pressure prevailing on the outer diaphragm side becomes greater than or equal to the minimum operating pressure, whereby the rocker structure is transferred into the operating mode.

2. The micromechanical component as recited in claim 1, wherein when the pressure prevailing on the outer diaphragm side is above the reference pressure but below the minimum operating pressure, the rocker structure is adjustable and/or tiltable by the diaphragm warping into the interior volume in such a way that a respective gap width of the at least one open gap between the at least one stop face of the rocker structure and the boundary surface decreases.

3. The micromechanical component as recited in claim 1, wherein the rocker structure has at least one first electrode and is suspended at the at least one first electrode on the inner diaphragm side, and the rocker structure in the operating mode is able to be set into the rocker motion by the diaphragm warping into the internal volume in such a way that a first distance between the at least one first electrode and the boundary surface decreases.

4. The micromechanical component as recited in claim 3, wherein the rocker structure includes, in addition to the at least one first electrode, at least one second electrode, and the rocker structure in the operating mode is able to be set into the rocker motion by the diaphragm warping into the interior volume in such a way that a second distance between the at least one second electrode and the boundary surface increases.

5. The micromechanical component as recited in claim 4, wherein the at least one second electrode is attached to the at least one first electrode via at least one intermediate component of the rocker structure, and at least the at least one intermediate component of the rocker structure in the operating mode is tiltable about respectively one tilting axis oriented in parallel to the substrate surface by the diaphragm warping into the internal volume.

6. The micromechanical component as recited in claim 5, wherein the at least one stop face of the rocker structure is respectively developed on a projection of the at least one intermediate component oriented toward substrate.

7. The micromechanical component as recited in claim 4, wherein when the pressure prevailing on the outer diaphragm side is above the reference pressure but below the minimum operating pressure, the rocker structure is adjustable and/or tiltable by the diaphragm warping into the interior volume in such a way that the second distance between the at least one second electrode and the boundary surface decreases.

8. The micromechanical component as recited in claim 4, wherein the micromechanical component further comprises at least one first counter electrode and at least one second counter electrode as the at least one intermediate layer covering the substrate surface at least partially, and the boundary surface includes outer surfaces of the at least one first counter electrode and of the at least one second counter electrode facing away from the substrate surface, and the first distance between the at least one first electrode and the boundary surface is equal to a distance between the at least one first electrode and the at least one first counter electrode and the second distance between the at least one second electrode and the boundary surface is equal to a distance between the at least one second electrode and the at least one second counter electrode.

9. The micromechanical component as recited in claim 8, wherein when the pressure prevailing on the outer diaphragm side is equal to the minimum operating pressure, the second distance between the at least one second electrode and the at least one second counter electrode is smaller than the first distance between the at least one first electrode and the at least one first counter electrode.

10. A pressure sensor device, comprising:
    a micromechanical component, including:
      a substrate having a boundary surface formed by a substrate surface of the substrate and/or by at least one intermediate layer at least partially covering the substrate surface;
      a frame structure, situated on the boundary surface, including a diaphragm whose inner diaphragm side borders on an interior volume, framed by the frame structure and having a reference pressure prevailing within, in such a way that the diaphragm is warped into the interior volume when a pressure prevailing on an outer diaphragm side facing away from the inner diaphragm side is above the reference pressure; and a rocker structure suspended on the inner diaphragm side, which at least in an operating mode of the rocker structure is able to be set into a rocker motion by the diaphragm warping into the interior volume;

wherein when a pressure prevailing on the outer diaphragm side is above the reference pressure, but below a predefined minimum operating pressure, an open gap exists respectively between at least one stop face of the rocker structure and the boundary surface, which is closed only when the pressure prevailing on the outer diaphragm side becomes greater than or equal to the minimum operating pressure, whereby the rocker structure is transferred into the operating mode.

11. A method for producing a micromechanical component for a pressure sensor device, comprising the following steps:

mounting a frame structure on a boundary surface formed by a substrate surface of a substrate and/or by at least one intermediate layer at least partially covering the substrate surface;

mounting a diaphragm on the frame structure in such a way that an inner diaphragm side of the diaphragm borders on an interior volume, framed by the frame structure and having a reference pressure prevailing within, in such a way that the diaphragm is warped into the interior volume when a pressure prevailing on an outer diaphragm side facing away from the inner diaphragm side is above the reference pressure; and suspending a rocker structure on the inner diaphragm side, which at least in an operating mode of the rocker structure is able to be set into a rocker motion by the diaphragm warping into the interior volume;

wherein the rocker structure is suspended on the inner diaphragm side in such a way that when the pressure prevailing on the outer diaphragm side is above the reference pressure, but below a predefined minimum operating pressure, an open gap exists respectively between at least one stop face of the rocker structure and the boundary surface, which is closed only when a pressure prevailing on the outer diaphragm side becomes greater than or equal to the minimum operating pressure, whereby the rocker structure is transferred into the operating mode.

\* \* \* \* \*